US012166030B2

United States Patent
Chiang et al.

(10) Patent No.: US 12,166,030 B2
(45) Date of Patent: Dec. 10, 2024

(54) ELECTROSTATIC DISCHARGE PROTECTION DEVICE AND METHOD OF MAKING

(71) Applicant: TAIWAN SEMICONDUCTOR MANUFACTURING COMPANY, LTD., Hsinchu (TW)

(72) Inventors: Tzu-Hao Chiang, Hsinchu (TW); Wun-Jie Lin, Hsinchu (TW); Jam-Wem Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/360,453

(22) Filed: Jul. 27, 2023

(65) Prior Publication Data
US 2023/0411381 A1   Dec. 21, 2023

Related U.S. Application Data

(63) Continuation of application No. 17/354,870, filed on Jun. 22, 2021, now Pat. No. 11,756,953.

(60) Provisional application No. 63/157,219, filed on Mar. 5, 2021.

(51) Int. Cl.
*H01L 27/02*   (2006.01)
*H01L 29/06*   (2006.01)

(52) U.S. Cl.
CPC ...... *H01L 27/0248* (2013.01); *H01L 29/0649* (2013.01); *H01L 29/0692* (2013.01)

(58) Field of Classification Search
CPC ............. H01L 27/0248; H01L 27/0259; H01L 27/027; H01L 27/0623; H01L 29/0649; H01L 29/0692; H01L 29/0673
See application file for complete search history.

(56) References Cited

U.S. PATENT DOCUMENTS

| | | | |
|---|---|---|---|
| 7,260,442 B2 | 8/2007 | Hwang et al. | |
| 9,256,709 B2 | 2/2016 | Yu et al. | |
| 9,263,401 B2* | 2/2016 | Hellings | H01L 29/66098 |
| 10,062,682 B1* | 8/2018 | Mallikarjunaswamy | H01L 27/0262 |
| 2007/0152275 A1 | 7/2007 | Ker et al. | |
| 2014/0040838 A1 | 2/2014 | Liu et al. | |
| 2014/0235026 A1* | 8/2014 | Zhan | H01L 27/0259 438/322 |
| 2015/0278429 A1 | 10/2015 | Chang | |

(Continued)

*Primary Examiner* — Dao H Nguyen
(74) *Attorney, Agent, or Firm* — Hauptman Ham, LLP

(57) ABSTRACT

A semiconductor device includes a substrate. The semiconductor device further includes a doped well in the substrate, wherein the doped well comprises a first concentration of dopants of a first type in the substrate. The semiconductor device further includes a doped region in the substrate, wherein the doped region comprises a second concentration of the dopants of the first type, the doped region extends around the doped well, and the doped region is electrically insulated from the doped well. The semiconductor device further includes an active area, and wherein the active area comprises an emitter region and a collector region, wherein the emitter region is electrically connected to the doped region. The semiconductor device further includes a deep trench isolation (DTI) structure extending through the active area and between the emitter region and the collector region.

20 Claims, 10 Drawing Sheets

(56) References Cited

U.S. PATENT DOCUMENTS

2016/0148925 A1* 5/2016 Tonazzo ............... H01L 29/78
　　　　　　　　　　　　　　　　　　　　　257/361
2019/0378833 A1* 12/2019 Choi .................. H01L 27/0259
2020/0373293 A1　 11/2020 Baek

* cited by examiner

ELECTROSTATIC DISCHARGE PROTECTION DEVICE AND METHOD OF MAKING

PRIORITY CLAIM

The present application is a continuation of U.S. application Ser. No. 17/354,870, filed Jun. 22, 2021, which claims the priority of U.S. Provisional Application No. 63/157,219, filed Mar. 5, 2021, which are incorporated herein by reference in their entireties.

BACKGROUND

Electrostatic discharge (ESD) in semiconductor devices has the potential to cause damage to the semiconductor devices and reduce the functionality of such devices, or cause the device to stop functioning entirely. Dielectric breakdown and electromigration are common failure modes for ESD damage to semiconductor devices. Reduction of ESD damage to semiconductor devices during a manufacturing process increases manufacturing yield and provides for more flexible manufacturing conditions for the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
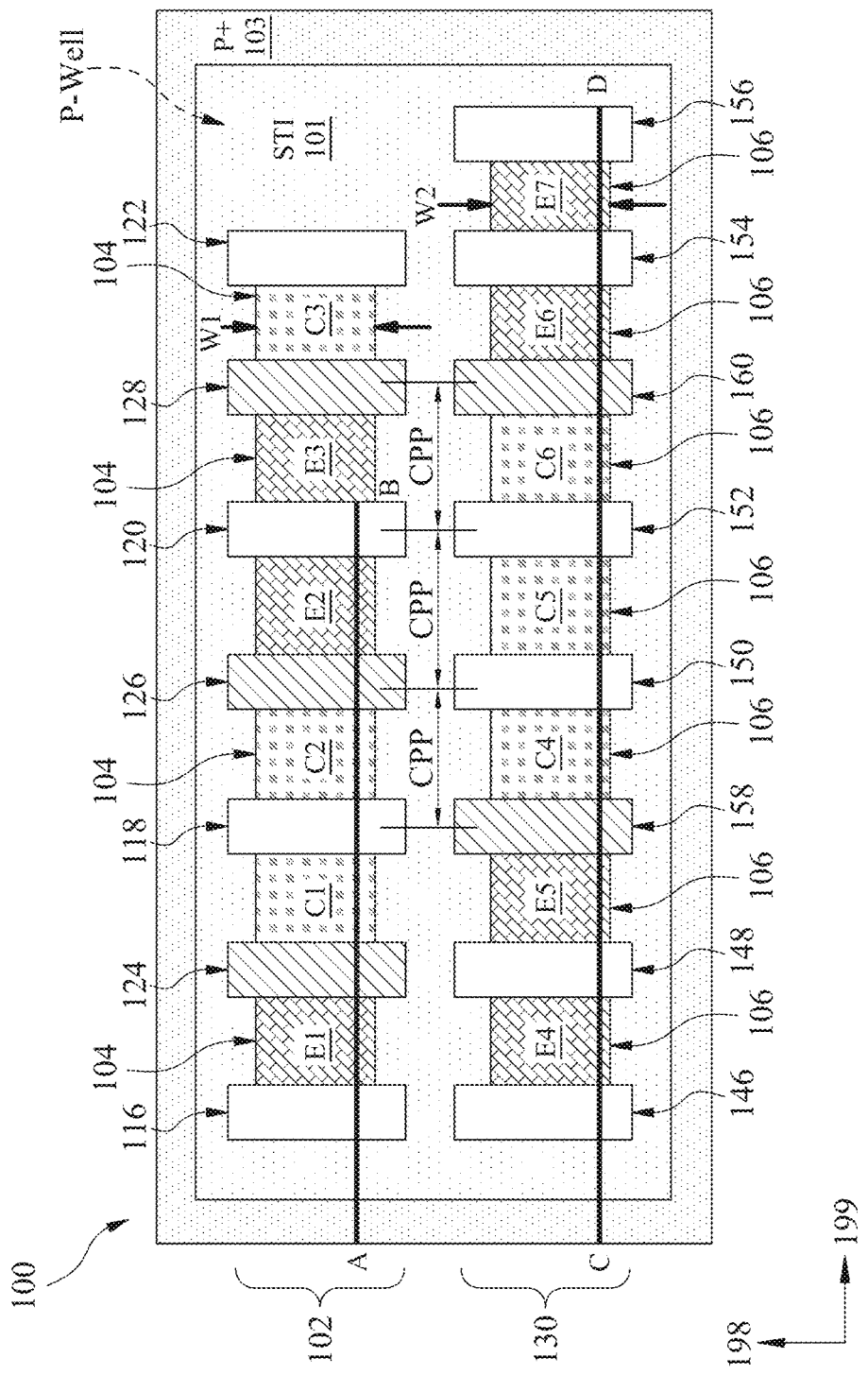
FIG. 1 is a top view of a semiconductor device, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some semiconductor devices with electrostatic discharge (ESD) protection devices, an emitter and a collector for ESD protection devices are in different active areas (multiple-active-area (MAA) devices) of the semiconductor device. The different active areas are separated by a shallow trench isolation structure (STI). In some MAA ESD protection devices, the STI between emitter and collector is about 1 micron (µm) in length. The separation distance between collector and emitter regions in MAA ESD protection devices makes the ESD protection devices larger than individual functional transistors of the semiconductor device. Including an ESD protection device in a semiconductor device increases the die area and the manufacturing cost for the semiconductor devices which contain the MAA ESD protection devices. Further, the pattern of elements in an MAA ESD protection device is significantly different from the pattern of elements in functioning (e.g., "logic") transistors of the semiconductor device, causing the MAA ESD protection device to be isolated from functioning transistors, increasing the complexity of interconnect structure design for such semiconductor devices. In MAA ESD protection devices, the large (e.g., about 1 µm) separation distance between collector and emitter causes the MAA ESD protection devices to have low gain, which makes operation at low voltages problematic, or impossible.

In the present disclosure, an ESD protection device has collector and emitter regions in the same active area (SAA) (e.g., single active area, or SAA, ESD protection devices). An SAA ESD protection device uses much less die area than an MAA ESD protection device because the isolation structures between collector and emitter are significantly smaller in the SAA ESD protection device as compared with the MAA ESD protection device. Further, SAA ESD protection devices have increased flexibility of placement in the semiconductor device layout as compared to MAA ESD protection devices because SAA ESD protection devices have a same line pitch and spacing for both active areas and poly lines (conductive lines which operate as gate electrodes for the ESD protection device) as logic transistors in the semiconductor device.

FIG. 1 is a top view of a semiconductor device 100, in accordance with some embodiments. Semiconductor device 100 includes SAA ESD protection device 102 and SAA ESD protection device 130. Semiconductor device 100 includes a P-well (not shown) underneath a shallow trench isolation (STI) region 101 (also referred to as STI) which surrounds a perimeter of SAA ESD protection device 102 and SAA ESD protection device 130. For purposes of the present disclosure, an STI region is an isolation region which has approximately the same depth as the P-doped well which surrounds the SAA ESD protection device in the semiconductor device. An STI region has a depth measured into the substrate from the top surface of the substrate, or the top surface of the active area adjacent to the STI region. Suitable materials for the STI region 101 include, for example, silicon dioxide ($SiO_2$), nitrogen-bearing oxide (e.g., nitrogen-bearing $SiO_2$), nitrogen-doped oxide (e.g., $N_2$-implanted $SiO_2$), silicon oxynitride ($Si_xO_yN_z$), and the like. In some embodiments, the STI region is manufactured by performing an oxidation step on the sides and bottom of an opening etched into the substrate, and the oxide formed thereby comprises the substrate material atoms in proportions to the concentration of the substrate material atoms in the substrate. In some embodiments, the STI region 101 are also formed of any suitable "high dielectric constant" or "high κ" material, where κ is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. In some embodiments, the STI material is formed by atomic layer deposition (ALD), chemical vapor deposition (CVD), or similar process for depositing dielectric materials. A P-doped region 103, which has a higher concentration of P-type dopants than the P-well, extends along a perimeter of STI region 101.

SAA ESD protection device 102 includes, across a same active area 104, an emitter region E1, collector regions C1 and C2, emitter regions E2 and E3, and collector region C3. Each emitter region is separated from an adjacent collector region by a deep isolation structure (also referred to as a deep trench isolation structure or DTI), see, e.g., emitter region E1 separated from collector region C1 by a DTI 124. For purposes of the present disclosure, a deep trench isolation structure is an isolation structure which extends through the active area between a collector region and an emitter region of the SAA ESD protection device. In some embodiments, a DTI has a depth dimension measured from the top surface of the active area of approximately 1.2 to 2.0 times deeper than a depth dimension of the STI region measured from the top surface of the active area. According to some embodiments, other values of the DTI depth dimension smaller than 1.2 times the depth dimension of the STI region as measured above are compatible with aspects of the present disclosure. According to some embodiments, other values of the DTI depth dimension larger than 2.0 times the depth dimension of the STI region as measured above are compatible with aspects of the present disclosure. In semiconductor device 100, DTI 124 separates emitter region E1 from collector region C1, a DTI 126 separates collector region C2 from emitter region E2, and a DTI 128 separates emitter region E3 from collector region C3.

In the present disclosure, emitter regions and collector regions comprise semiconductor material in regions of the active area where openings have been formed, e.g., by an etch process, and the emitter region material/collector region material has been grown in the opening, e.g., by an epitaxial process. In some embodiments, epitaxially grown semiconductor material comprises a type IV semiconductor. In some embodiments, the epitaxially grown semiconductor material comprises a type III-V semiconductor material. In some embodiments, the epitaxially grown semiconductor material comprises silicon (Si), silicon germanium (SiGe), or another compound semiconductor material compatible with collector and emitter regions in an ESD device. In some embodiments, the semiconductor material contains N-type dopants in order to create a junction with the P-doped well substrate material. In some embodiments, the N-type dopants in the N-doped semiconductor material induce strain which modifies the current-carrying characteristics of the emitter and collector regions.

Gate structures 116, 118, 120, and 122 are over the active area 104 between adjacent collector regions (see gate structure 118), or adjacent emitter regions (see gate structure 120). In some embodiments, the gate structures include a gate dielectric material. (See, e.g., gate dielectric 205 of gate structure 216 of semiconductor device 200, as described below). In some embodiments, the gate structure includes a polysilicon electrode material. In some embodiments, the gate structure includes a conductive electrode material. In some embodiments, the gate structure includes a metal electrode material.

In some embodiments, the gate structures are over active area fins (not shown, but see semiconductor device 200 of FIG. 2A) such as are manufactured for a fin field effect transistor (FinFET) device (not shown). In some embodiments, the gate structures are over active area nanosheets (not shown, but see semiconductor device 250 of FIG. 2B) such as are manufactured for gate all around (GAA) transistor devices (not shown).

In SAA ESD protection device 102, the active area (e.g., the emitter regions and the collector regions) has a major axis (not shown) extending in a first direction 199 along an edge of the STI 101 between SAA ESD protection device 102 and SAA ESD protection device 130. A second direction 198 extends perpendicular to the first direction 199. In SAA ESD protection device 102, an active area width W1 is measured in the second direction 198 from an edge of the STI 101 at a first side of the active area, to an edge of the STI 101 at a second side of the active area opposite from the first side of the active area.

In SAA ESD protection device 102, the DTI structures and the gate structures are separated from each other along the first direction 199 at a first separation distance CPP, which corresponds to a separation distance for gate structures in functional (e.g., "logic") transistors (not shown, but see semiconductor device 400 in FIG. 4, and semiconductor device 500, in FIG. 5, described below) of the semiconductor device 100.

A separation parameter of an SAA ESD protection device is a numeral which reflects information about the SAA ESD protection device structure. In some embodiments, the separation parameter is a common parameter for the ESD protection device at multiple locations across a semiconductor device. SAA ESD protection device 102 has the separation parameter $N_{SAA}$ of 1 ($N_{SAA}=1$). For an SAA ESD protection device, $N_{SAA}$ is calculated as follows: [1] count the number of gate structures ($N_G$) between the two nearest-DTI along an active area length ($N_{SAA}=N_G$), or [2] add up the number of intervals between the DTI ($N_{CPP}$), and subtract "1" from the sum (e.g., $N_{SAA}=N_{CPP}-1$). In SAA ESD protection device 102, $N_{SAA}=1$ because one gate structure is between each pair of DTI which are spaced 2×CPP apart. Cross-sectional line A-B extends along the first direction 199.

In semiconductor device 100, SAA ESD protection device 130 includes active area 106 which includes, moving along the long axis of the active area 106, emitter regions E4 and E5, collector regions C4, C5, and C6, and emitter regions E6 and E7. Active area 106 has an active area width W2. In SAA ESD protection device 130, two gate structures (see, e.g., gate structures 150 and 152) are between each pair of DTI which are spaced 3 CPP intervals ($N_{CPP}$=3) apart. Thus $N_{SAA}=N_G=2$ and $N_{SAA}=N_{CPP}-1=2$. In active area 106, DTI structure 158 separates emitter region E5 from collector region C4. DTI structure 160 separates collector region C6 from emitter region E6. Deep trench isolation structures are portions of dielectric material which have a width larger than the width of the active area 106 (e.g., W2) and a dimension which extends in the vertical direction which is larger than the dimension of an STI in the semiconductor device. A DTI divides, or extends between, portions of a fin or nanosheet structure in the collector region and in the emitter region of an active area.

Gate structures 146 and 148 are adjacent to and at opposite sides of emitter region E4, gate structures 150 and 152 are adjacent to and at opposite sides of collector region C5, and gate structures 154 and 156 are adjacent to and at opposite sides of emitter region E7.

Figure 2A:
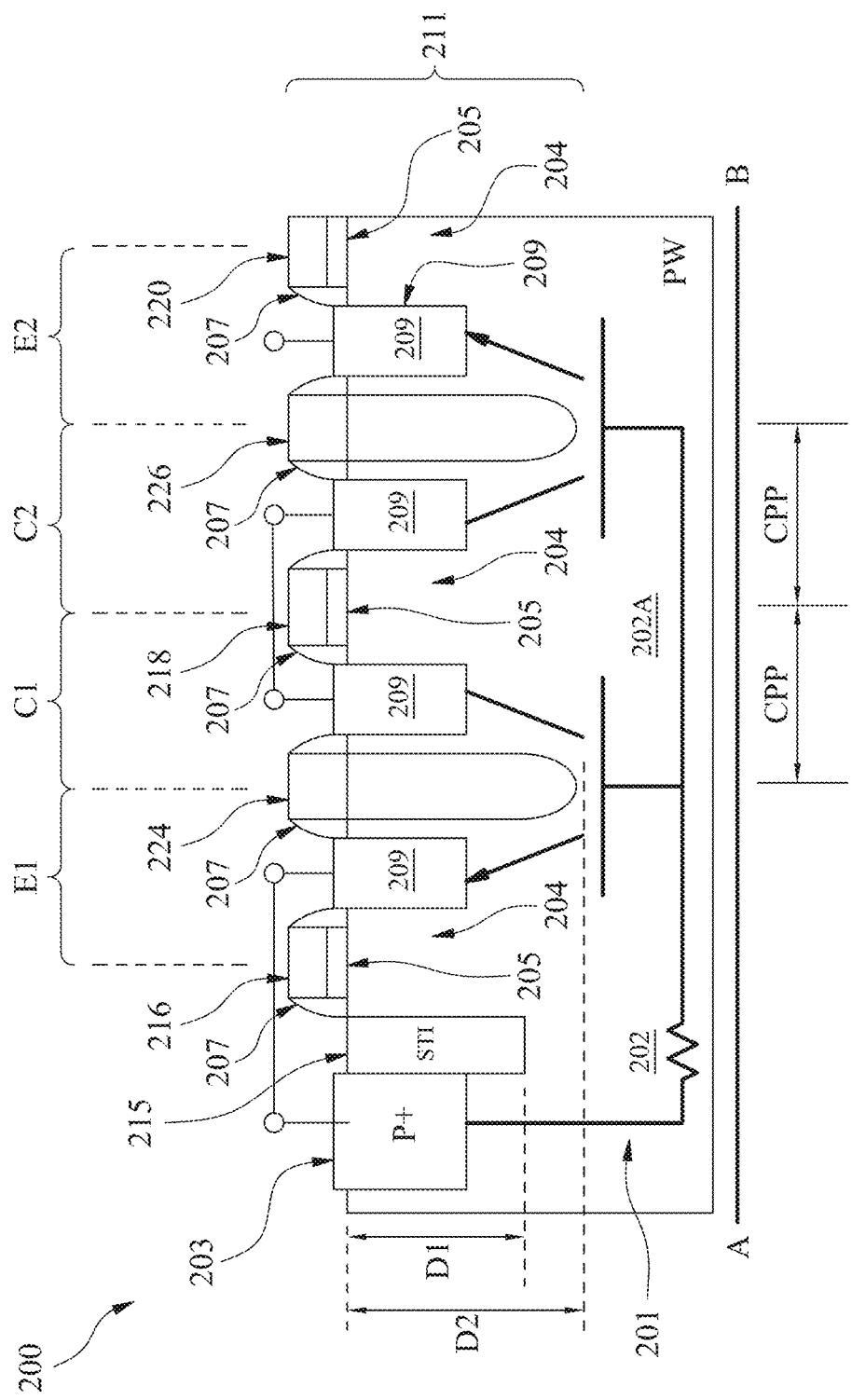
FIGS. 2A-2B are cross-sectional views of semiconductor devices, in accordance with some embodiments.
Figure 2B:
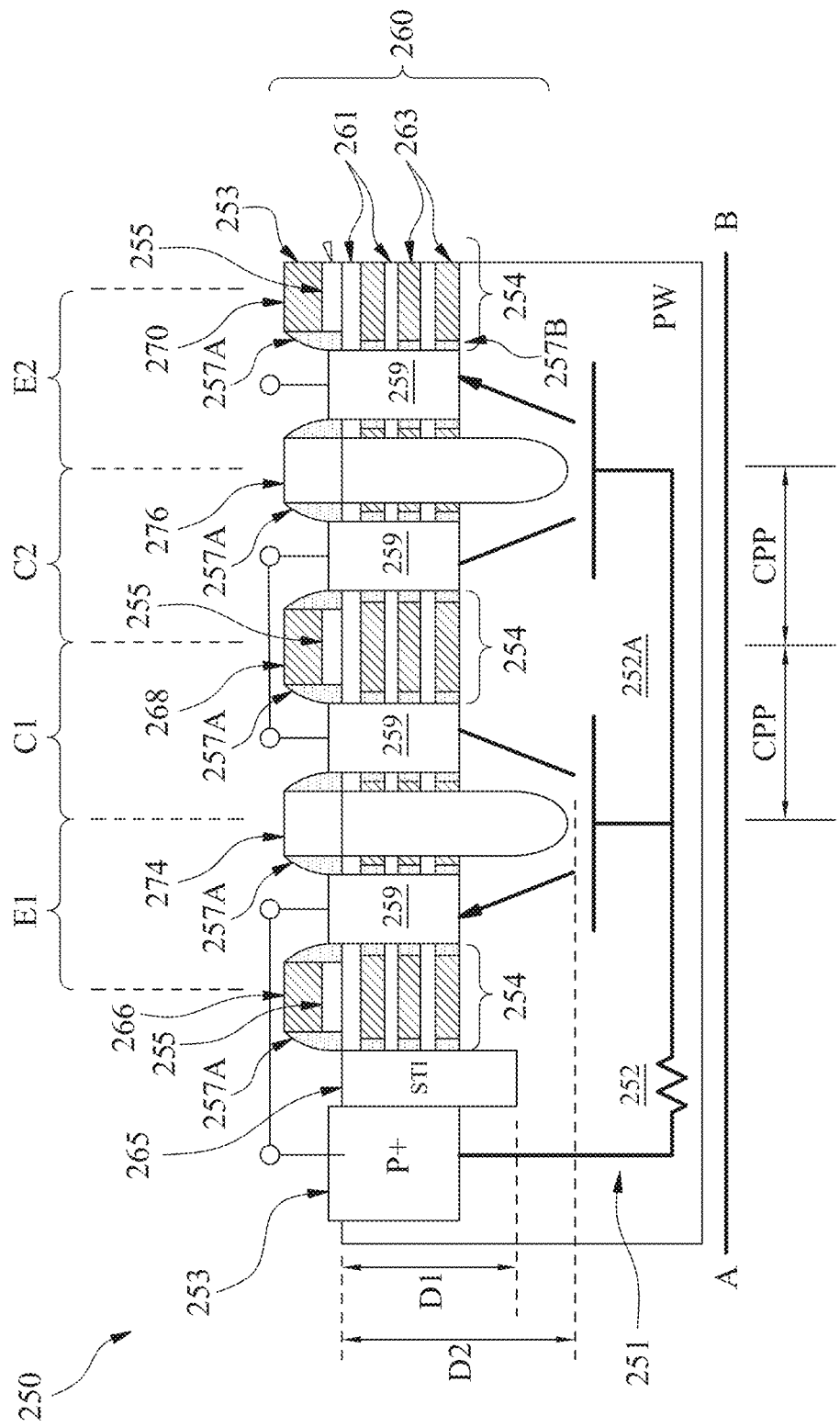

FIGS. 2A-2B are cross-sectional views of semiconductor devices, in accordance with some embodiments. In FIG. 2A, the channel regions 204 of semiconductor device 200 are monolithic portions of substrate material (e.g., fins of a FinFET device). Semiconductor device 200 corresponds, structurally, to the SAA ESD protection device 102 of FIG. 1. In FIG. 2B, the active areas 260 of semiconductor device 250 comprise channels in nanosheets over a substrate. Semiconductor device 250 corresponds, structurally, to the SAA ESD protection device 130 of FIG. 1. The manufacture of active areas of ESD protection devices of a semiconductor device is described below in operation 606 of method 600.

In FIG. 2A, semiconductor device 200 includes emitter regions E1 and E2, separated by collector regions C1 and C2. Collector regions C1 and C2 have a gate structure 218 at a border shared by collector region C1 and C2. Emitter region E1 is separated from collector region C1 by a DTI 224. Collector region C2 is separated from emitter region E2 by DTI 226.

In semiconductor device 200, substrate 202 includes channel regions 204 below gate structures 216, 218, and 220. Gate dielectric material 205 separates gate structure 216, gate structure 218, and gate structure 220 from channel regions 204 in substrate 202. Spacers 207 are in contact with the sidewalls of gate structures 216, 218, and 220, and in contact with the sides of gate dielectric material 205 between gate structures 216, 218, and 220 and the channel regions 204 below gate structures 216, 218, and 220. Spacer 207 adjacent to DTI 224 and DTI 226 is in contact with the substrate 202 (or directly in contact with the channel region 204 below gate structures 216, 218, and 220, and directly in contact with the sides of the DTI).

In semiconductor device 200, a DTI 224 extends below the depth of STI 215 in substrate 202 and separates emitter region E1 from collector region C1. A DTI 226 extends below the depth of STI 215 in substrate 202 and separates collector region C2 from emitter region E2. In FIG. 2A, a conductive path 201 is drawn on the semiconductor device 200 to indicate a path of current flow when the SAA ESD protection device 211 is in operation. Emitter regions E1 and E2, and collector regions C1 and C2, comprise epitaxially-grown material 209 which fills openings etched into the substrate 202 to create the fins and channel regions 204.

In some embodiments, the substrate 202 is a P-doped material with a P-type dopant concentration smaller than $1\times10^{15}$. Substrate 202 includes a P-doped well 202A, having a concentration of P-type dopants ranging from $1\times10^{12}$ to $1\times10^{13}$ atoms/cm$^2$. According to some embodiments, concentrations of P-type dopant in the substrate smaller than $10\times10^{12}$ atoms/cm$^2$ are compatible with aspects of the present disclosure. According to some embodiments, concentrations of P-type dopant in the substrate larger than $10\times10^{13}$ atoms/cm$^2$ are compatible with aspects of the present disclosure. The P-type dopant concentrations of substrate 202 are similar to the dopant concentrations found in FinFET semiconductor devices. For dopant concentrations smaller than $1\times10^{12}$, leakage current between active areas and a ground connection reduces the efficiency of semiconductor devices. For dopant concentrations larger than $1\times10^{13}$ atoms/cm$^2$, the sensitivity of the SAA ESD protection device is reduced making the SAA ESD protection device less effective at responding to electrostatic discharge events or transient voltages.

In FIG. 2B, the active areas 260 of semiconductor device 250 comprise channel regions 254 of nanosheets over a substrate 252. Elements of semiconductor device 250 which correspond to elements of semiconductor device 200 have a same identifying numeral, incremented by 50. Substrate 252 is P-doped with a P-type dopant concentration ranging from $1\times10^{13}$ to $1\times10^{14}$ atoms/cm$^2$. According to some embodiments, concentrations of P-type dopant in the substrate smaller than $10\times10^{13}$ atoms/cm$^2$ are compatible with aspects of the present disclosure. According to some embodiments, concentrations of P-type dopant in the substrate larger than $10\times10^{14}$ atoms/cm$^2$ are compatible with aspects of the present disclosure. The P-type dopant concentrations of substrate 202 are similar to the dopant concentrations found in FinFET semiconductor devices. For dopant concentrations smaller than $1\times10^{13}$, leakage current between active areas and a ground connection reduces the efficiency of semiconductor devices. For dopant concentrations larger than $1\times10^{14}$ atoms/cm$^2$, the sensitivity of the SAA ESD protection device is reduced making the SAA ESD protection device less effective at responding to electrostatic discharge events or transient voltages. In FIG. 2B, a conductive path 251 is drawn on the semiconductor device 250 to indicate a path of current flow when the active areas 260 are in operation.

In some embodiments, the active areas of an SAA ESD protection device are the same kind of active areas as logic transistors of the semiconductor device wherein the SAA ESD protection device is located. In some embodiments, the active areas of the SAA ESD protection device and the active areas of the logic transistors of a semiconductor device comprise nanosheet active areas. In some embodiments, the active areas of the SAA ESD protection device and the active areas of the logic transistors of the semiconductor device comprise fins used in FinFET transistors. In some embodiments, the active areas of the SAA ESD protection device and the active areas of the logic transistors of the semiconductor device comprise planar transistor-type active areas.

In semiconductor device 250, collector regions C1 and C2 are between emitter regions E1 and E2. DTI 274 separates collector region C1 from emitter region E1. DTI 276 separates collector region C2 from emitter region E2. Gate structure 266 is at an opposite side of emitter region E1 from DTI 274. Gate structure 268 is at an opposite side of collector region C1 from DTI 274, and at an opposite side of collector region C2 from DTI 276. Gate structure 270 is at an opposite side of emitter region E2 from DTI 276.

Emitter region E1 and emitter region E2 include epitaxially-grown N-doped semiconductor material 259. Collector region C1 and collector region C2 also include epitaxially-grown N-doped semiconductor material 259. In some embodiments, the N-type dopant concentration of N-doped semiconductor material 259 ranges from $5 \times 10^{12}$ to $5 \times 10^{14}$ atoms/cm². For N-type dopant concentrations below $5 \times 10^{12}$, the bipolar junction transistor (BJT) formed by the P-doped region 253, the P-doped well 252A in substrate 252, and the N-doped semiconductor material 259 allows for parasitic current to flow because the depletion zone is too thin. According to aspects of the present disclosure, the doping concentration of the bipolar junction transistor (BJT) should be higher in the collector and lower in the base region such that the triggering voltage of the device is within operating specifications of the semiconductor device. Such a parasitic BJT will turn on only when the reverse current in the collector/base junction is high enough to increase the base potential to over a predetermined voltage, e.g., 0.7 V, at forward bias. The bipolar junction transistor is insensitive to small variations in dopant concentrations, e.g., variations smaller than $1 \times 10^{14}$ atoms/cm². To increase the reverse current effectively, however, the doping concentration differential in the collector/base junction is increased to strengthen the junction electric field. A dopant concentration differential between the emitter and collector regions of the SAA ESD protection device and the substrate (or, the P-doped region in which the emitter and collector regions are located) is generally 5:1 (e.g., the emitter and collector regions have a dopant concentration of at least 5 times the dopant concentration of the P-doped region in which the active area is located). For dopant concentration differentials greater than about 15:1, the potential which triggers the function of the SAA ESD protection device is so large that the semiconductor device experiences damage before the SAA ESD protection device is activated to divert current away from the logic transistors and other semiconductor device elements.

In semiconductor device 250, channel regions 254 are over substrate 252. Channel regions 254 are nanosheet structures which include alternating layers of materials (e.g., layers 261 and 263) from which a gate-all-around (GAA) transistor is formed during a manufacturing process. DTIs 274 and 276 have larger dimensions in a direction perpendicular to the surface of the substrate 252 than the channel regions 254 of semiconductor device 250 and the STI 265.

Gate structures 266, 268, and 270 are dummy electrodes in semiconductor device 250. Dummy electrodes are not electrically connected to the interconnect structure of the semiconductor device, but are manufactured in the semiconductor device in order to promote uniformity of features of the semiconductor device during the manufacturing flow. Gate structures 266, 268, and 270 provide for accurate dimensions of the N-doped semiconductor material (see N-doped semiconductor material 259) of the collector and emitter regions of the semiconductor device, because the spacers or spacer material at the sides of the gate electrode material in the gate structures mask the substrate material during the process of etching DTIs. Gate dielectric material 255 separates gate structure 266, gate structure 268, and gate structure 270 from channel regions 254 in substrate 252. Spacers 257A are in contact with the sidewalls of gate structures 226, 228 and 270, and in contact with the sides of gate dielectric material 255 between gate structures 266, 268 and 270 and the channel regions 254 below gate structures 266, 268 and 270.

Figure 3:
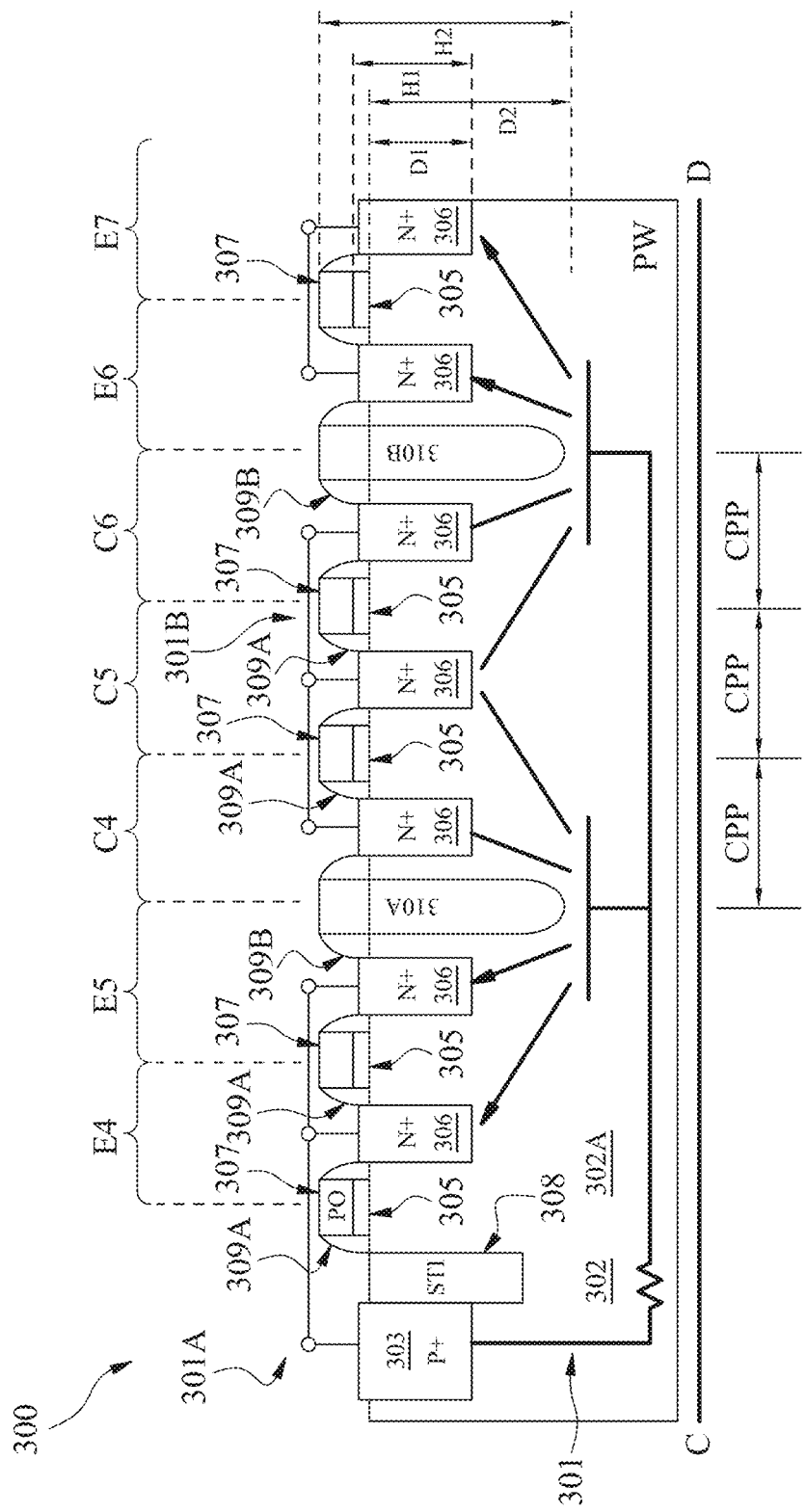
FIG. 3 is a cross-sectional view of a semiconductor device, in accordance with some embodiments.

FIG. 3 is a cross-sectional view of a semiconductor device 300, in accordance with some embodiments. Semiconductor device 300 is similar to semiconductor device 100 along the cross-sectional line C-D through SAA ESD protection device 130. In semiconductor device 300, a conductive path 301A for electrical current outside of the substrate 302, and a conductive path 301 for electrical current through the substrate 302 during operation of the semiconductor device 300 during an ESD event is marked on the cross-sectional view. Semiconductor device 300 includes a substrate 302 through which electrical current flows from the P-doped region 303 to the N-doped semiconductor material 306 of the emitter regions (see emitter regions E4, E5, E6, and E7). The substrate 302 provides resistance to the current flow, as current also flows to the emitter regions E4-E7 from the collector regions C4, C5, and C6. Collector regions C4, C5, and C6 are electrically connected in parallel by electrical connection 301B outside of the substrate 302. Emitter region E4 adjoins emitter region E5, and emitter region E6 adjoins emitter region E7. Collector region C5 is between and adjoins collector region C4, and collector region C6, at an opposite side of collector region C5 from collector region C4. DTI 310A separates collector region C4 from emitter region E5. DTI 310B separates collector region C6 from emitter region E6.

Each collector region C4-C6 and each emitter region E4-E7 includes a portion of N-doped semiconductor material 306 which extends into the substrate 302 to a first depth D1. N-doped semiconductor material 306 in the emitter regions E4-E7, and in the collector regions C4-C6, has a height H1, which extends from an end embedded in the substrate 302, to an end proximal to the gate structures 307 of semiconductor device 300.

STI 308 extends into substrate 302 between emitter region E4 and the P-doped region 303. STI 308 comprises, e.g., silicon dioxide ($SiO_2$) or some other dielectric material which deposited or grown along the edge of the active area of an SAA ESD protection device in order to electrically isolate the SAA ESD protection device from the P-doped region (see, e.g., P-doped region 303) and other circuit elements, including other SAA ESD protection devices.

DTIs 310A and 310B extend into the substrate 302 a second depth D2, where D2 is larger than D1. DTIs 310A and 310B have an isolation structure height H2 which extends from an end embedded in the substrate 302, to an end distal from the substrate 302.

Gate structures 307 are separated from the substrate 302 by a gate dielectric material 305, and a spacer material 309A is at the sides of the gate structure 307 and the gate dielectric material 305 for each gate structure in emitter regions E4-E7, and in collector regions C4-C7.

DTIs 310A and 310B have spacer material 309B in contact with an end of the DTI distal from the substrate 302 (e.g., an "upper portion" of the DTIs, whereas a "lower portion" of the DTIs is embedded in the substrate 302). During a manufacturing process, the gate structures located at the positions of DTIs 310A and 310B included both a gate structure 307, and a gate dielectric material 305, which were etched away from within the perimeter of spacer material 309B to expose the substrate 302, before the etch step to form the opening in the substrate which is filled with dielectric material to form the DTIs 310A and 310B.

Figure 4:
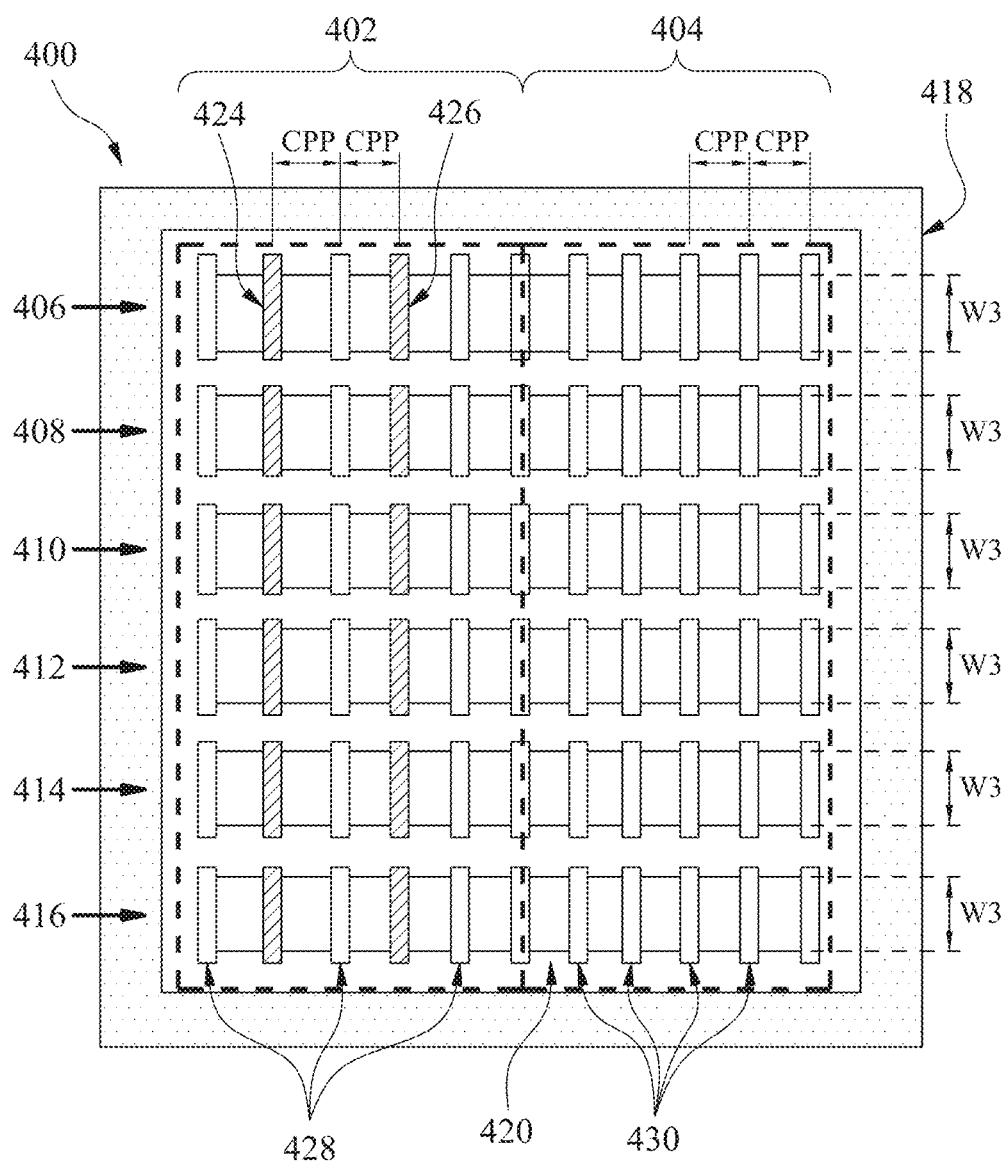
FIG. 4 is a top view of a semiconductor device, in accordance with some embodiments.

FIG. 4 is a top view of a semiconductor device 400, in accordance with some embodiments. Semiconductor device 400 differs from semiconductor device 500 in that there is no isolation structure between active areas of semiconductor device 400. In other words, SAA ESD protection device region 402 is immediately adjacent to a functional transistor region 404 with no isolation structure therebetween. Active areas 406, 408, 410, 412, 414, and 416 extend from SAA ESD protection device region 402 to functional transistor region 404 with a same width W3 in each of SAA ESD protection device region 402 and functional transistor region 404.

In semiconductor device 400, isolation region 420 extends around a perimeter of the adjacent SAA ESD protection device region 402 and the functional transistor region 404, and between the active areas 406, 408, 410, 412, 414, and 416.

In SAA ESD protection device region 402, gate structure 428 extends across a short dimension of the active areas 406, 408, 410, 412, 414, and 416, and DTIs 424 and 426 extends across a short dimension of the active areas 406, 408, 410, 412, 414, and 416. In SAA ESD protection device region 402, one gate structure 428 is between DTI 424 and DTI 426 in each active area. DTIs 424 and 426, and dummy electrodes 428, are separated from each other along a long dimension of the active areas 406, 408, 410, 412, 414, and 416 by a same separation distance (CPP).

In functional transistor region 404, the transistor electrodes 430 have a same separation distance (CPP) as the gate structures 428 and the DTIs 424 and 426 of SAA ESD protection device region 402. A P-doped region 418 extends around a shared perimeter of SAA ESD protection device region 402 and functional transistor region 404 (e.g., around the un-shared edges of SAA ESD protection device region 402 and functional transistor region 404).

Figure 5:
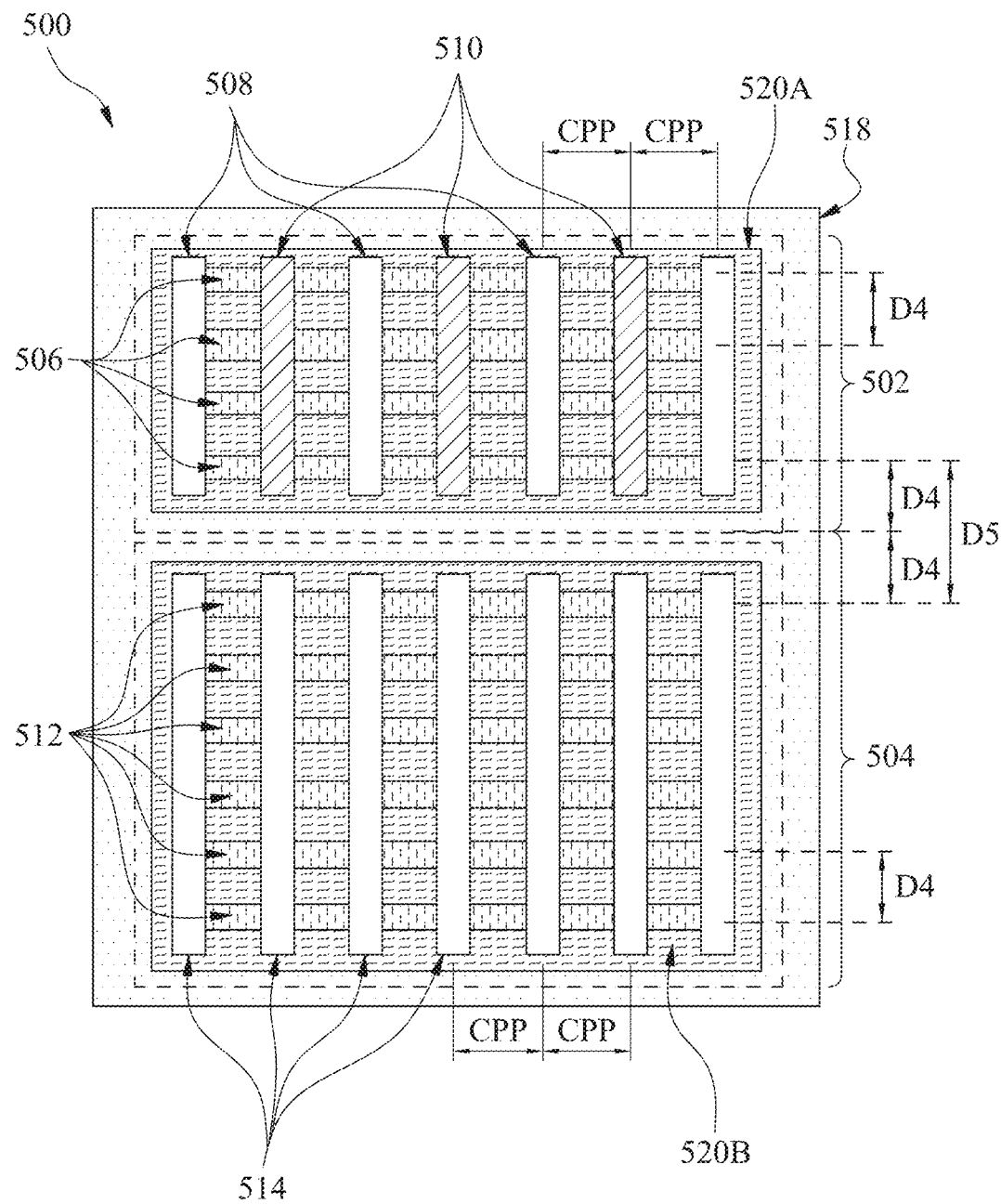
FIG. 5 is a top view of a semiconductor device, in accordance with some embodiments.

FIG. 5 is a top view of a semiconductor device 500, in accordance with some embodiments. Semiconductor device 500 differs from semiconductor device 400 in that an isolation region extends between active areas of semiconductor device 500. In other words, SAA ESD protection device region 502 is discontinuous from functional transistor region 504. SAA ESD protection device region 502 includes a first isolation region 520A which extends around and between the active areas 506 therein. Active areas 506 are positioned a fourth separation distance D4 apart from each other, perpendicular to the long dimension of the active areas 506.

In SAA ESD protection device region 502, DTIs 510 extend across a short dimension of the active area 506. In some embodiments, the DTIs are discontinuous, and are segmented to extend through the active areas 506, while a continuous portion of first isolation region 520A extends between the active areas 506. In some embodiments, the DTIs are continuous, and discontinuous portions of first isolation region 520A are between active areas 506 in SAA ESD protection device region 502.

Gate structures 508 extend parallel to DTIs 510 across the short dimension of the active areas 506. In some embodiments, the gate structures 508 are discontinuous, and are segmented to extend over the active areas 506, while a continuous portion of the first isolation region 520A extends between active areas 506 along a long dimension of the active areas 506. A P-doped region 518 extends around a perimeter of first isolation region 520A. Gate structures 508 and the DTIs 510 are positioned a first separation distance (CPP) apart from each other along the long dimension of the active areas 506 of SAA ESD protection device region 502.

In semiconductor device 500, a functional transistor region 504 is adjacent to the SAA ESD protection device region 502. A second isolation region 520B extends around a perimeter of functional transistor region 504. A P-doped region 518 extends around a perimeter of the second isolation region 520B. In functional transistor region 504, active areas 512 extend in a same direction as active areas 506 in SAA ESD protection device region 502. In functional transistor region 504, transistor electrodes 514 extend in a direction perpendicular to the active areas 512 (e.g., in a direction parallel to the dummy electrodes of gate structures 508, and the DTI 510 of SAA ESD protection device region 502). In functional transistor region 504, transistor electrodes 514 are positioned a first separation distance (CPP) apart from each other along the long dimension of the active areas 512 in functional transistor region 504. The first separation distance (CPP) in SAA ESD protection device region 502 and the functional transistor region 504 is the same separation distance.

In semiconductor device 500, the active areas 506 of SAA ESD protection device region 502 are separated by a separation distance D4 (e.g., the active areas have an active area "pitch" having a dimension equal to the separation distance D4). In semiconductor device 500, the active areas 512 of functional transistor region 504 are positioned at a separation distance D4 apart from each other (e.g., the active areas have an active area "pitch" of separation distance D4). In semiconductor device 500, the active area 506 in the SAA ESD protection device region 502 closest to the functional transistor region 504 is positioned a separation distance D5 away from the active area 512 in functional transistor region 504 which is closest to the SAA ESD protection device region 502. In semiconductor device 500, separation distance D5=2×D4. In some embodiments, the separation distance D5 is larger than 2×D4. In some embodiments, the separation distance D5=separation distance D4 (e.g., D5=D4).

Figure 6:
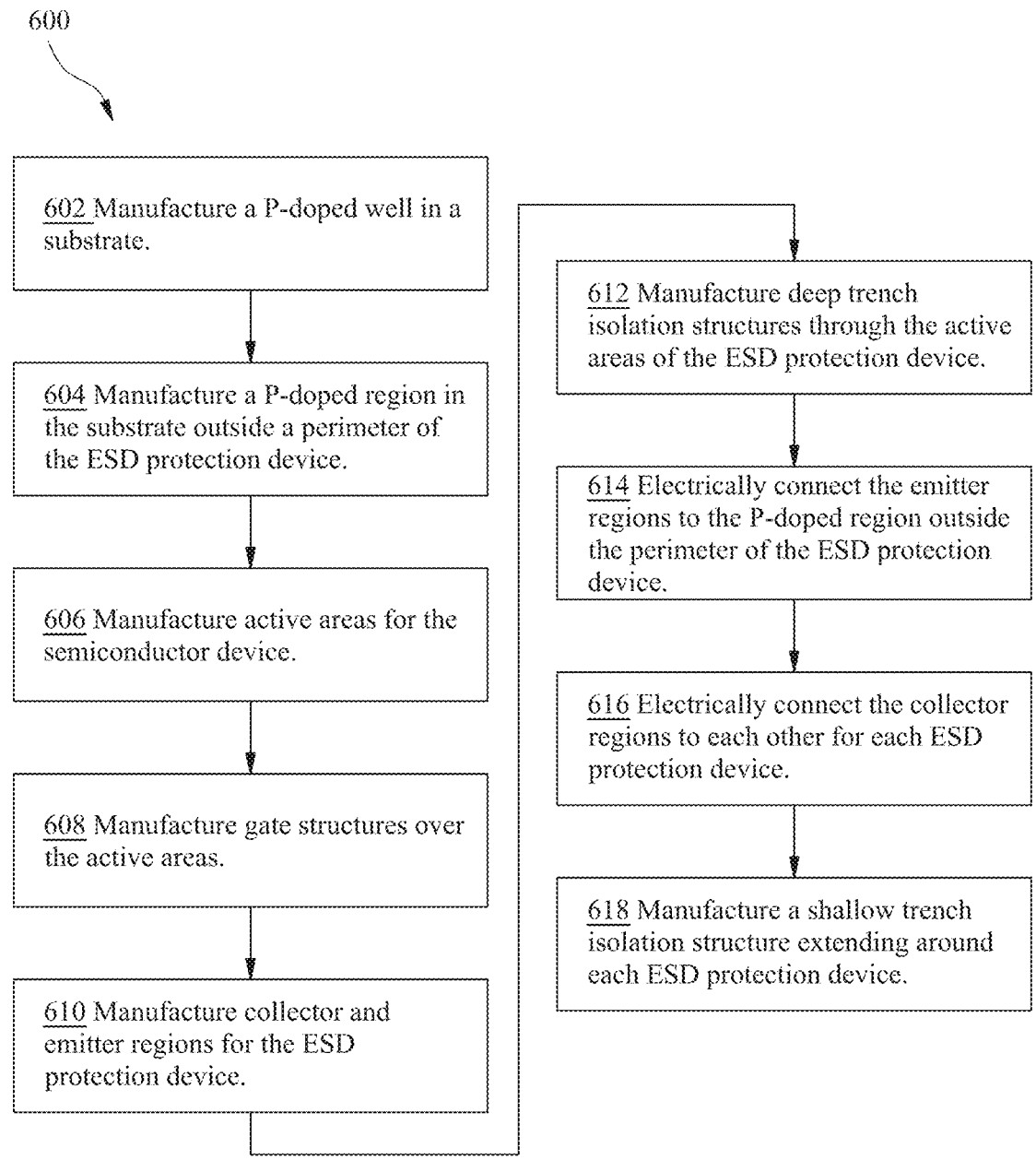
FIG. 6 is a flow diagram of a method of making a semiconductor device, in accordance with some embodiments.

FIG. 6 is a flow diagram of a method 600 of making a semiconductor device, in accordance with some embodiments.

Method 600 includes an operation 602, wherein a P-doped well is manufactured in a substrate. For an example of a P-doped well, refer to P-doped well 302A in FIG. 3 above. In some embodiments, the P-doped well is manufactured by depositing a layer of patterning material over the top surface of the substrate, transferring a pattern to the layer of patterning material, and performing a doping process into the substrate through openings in the layer of patterning material where the substrate is exposed. In some embodiments, the layer of patterning material is a photoresist material (PR) or a material compatible for ultraviolet (UV) lithography techniques, or some other patterning material known to practitioners of the art. In some embodiments, a pattern is transferred to the layer of patterning material by, e.g., a photolithography process, an immersion lithography process, a double-patterning lithography process, a quadruple-patterning lithography process, or some other lithography process known to practitioners of the art.

In some embodiments, the doping process is performed to a depth greater than the depth of the DTIs manufactured in operation 610, as described below.

Performing the doping process to form the P-doped well achieves a P-type dopant concentration of not less than $1\times10^{12}$ and not more than $1\times10^{13}$ atoms/cm$^2$, although, in some embodiments, the concentration of P-type dopants in the P-doped well is either higher, or lower, than the ranged described above. In embodiments of the semiconductor device having a P-doped well less than $1\times10^{12}$ results in a semiconductor device with a slow response time because of insufficient carrier concentration in the P-doped well in the substrate. In embodiments of the semiconductor device having a P-doped well more than $1\times10^{13}$ results in a semiconductor device with a BJT which is less likely to have sufficient gain to trigger rapid response of the SAA ESD protection device during an ESD event in the semiconductor device.

In some embodiments, the doping process is performed to a depth greater than 200 nanometers (nm). Thus, manufacturing the P-doped well by doping the substrate to less than about 200 nm (e.g., about 2 times as deep in the substrate as a DTI structure) increases the likelihood that the SAA ESD protection device will not function fast enough to protect the semiconductor device from electrical damage.

Method 600 includes an operation 604, wherein a P-doped region in the substrate, and outside a perimeter of the SAA ESD protection device, is manufactured. For an example of a P-doped region, refer to P-doped region 303 in FIG. 3 above. In some embodiments, the P-doped region is manufactured by depositing a layer of patterning material over the top surface of the substrate, transferring a pattern to the layer of patterning material, and performing a doping process into the substrate through openings in the layer of patterning material where the substrate is exposed. In some embodiments, the layer of patterning material is a photoresist material (PR) or a material compatible for ultraviolet (UV) lithography techniques, or some other patterning material known to practitioners of the art. In some embodiments, a pattern is transferred to the layer of patterning material by, e.g., a photolithography process, an immersion lithography process, a double-patterning lithography process, a quadruple-patterning lithography process, or some other lithography process known to practitioners of the art.

According to some embodiments, the doping process for the P-doped region in the substrate has a concentration of P-type dopants ranging from not less than $1\times10^{13}$ and not more than $1\times10^{14}$ atoms/cm$^2$. Other ranges of P-type dopants in the P-doped region are also within the scope of the present disclosure (see above). In embodiments of the semiconductor device having a P-doped well less than $1\times10^{13}$ results in a semiconductor device with a slow response time because of insufficient carrier concentration in the P-doped well in the substrate. In embodiments of the semiconductor device having a P-doped well more than $1\times10^{14}$ results in a semiconductor device with a BJT which has insufficient gain to trigger rapid response of the SAA ESD protection device during an ESD event in the semiconductor device.

Method 600 includes an operation 606, wherein active areas for the semiconductor device are manufactured. Examples of active areas include active area 406 in semiconductor device 400, and the fins of semiconductor material in P-doped well 302A of semiconductor device 300, described above. In some embodiments of operation 606, active areas of the semiconductor device are manufactured by performing a deposition process in the P-doped well (manufactured in operation 602, above) to modify the dopant concentration and tune the electrical characteristics of the SAA ESD protection device. In some embodiments, after the doping process (e.g., preparing to manufacture FinFET fins), the method continues with operation 608.

In some embodiments, active areas (FinFET fins) are manufactured by depositing a layer of patterning material over the top surface of the substrate, transferring a pattern to the layer of patterning material, and performing an etch process through openings in the pattern to remove exposed portions of the substrate, or of the P-doped well in the substrate, forming fins of semiconductor material (e.g., the substrate is a semiconductor material). In some embodiments, of operation 606, a dielectric material (e.g., a sacrificial fill material) is deposited into the openings formed in the substrate between the fins, to provide structural support for the fins during a manufacturing process. In some embodiments, the dielectric material (e.g., the sacrificial fill material) is removed by, e.g., a selective etch process (a liquid etch process, for example) prior to manufacturing of N-doped semiconductor material for the emitter regions and the collector regions therein as described below in the description of operation 610.

In some embodiments of operation 606, active areas of the semiconductor device are manufactured by depositing a layer of patterning material over the top surface of the substrate, transferring a pattern to the layer of patterning material, and performing an etch process through openings in the pattern to recess the P-doped well formed during operation 602. In some embodiments, the active area comprises a nanosheet structure, rather than a monolithic channel or fin structure. According to some embodiments, nanosheet-type active areas are used with gate-all-around (GAA) transistors.

According to some embodiments, a nanosheet structure for a semiconductor device is manufactured by depositing, in alternating layers, a layer of transistor material for the source region, the drain region, and the channel region of the semiconductor device, and a layer of spacing material. Transistor material for the nanosheet structure of the semiconductor device comprises, in some embodiments, a semiconductor material such as silicon, silicon germanium (SiGe, and e.g., having a germanium concentration of not less than 20% and not greater than 60% germanium), gallium arsenide (e.g., having an arsenic concentration of not less than 20% and not greater than 60% arsenic), and so forth. Spacing material for the nanosheet structure of the semiconductor device comprises, in some embodiments, a semiconductor material such as silicon (Si), silicon germanium (SiGe, and e.g., having a germanium concentration of not less than 20% and not greater than 60% germanium), gallium arsenide (GaAs), a dielectric material (e.g., SiO2), and so forth, wherein the spacing material and the transistor material are different materials which exhibit, under some etching conditions, significantly different etch rates and the spacing material is removed selectively while the transistor material remains behind in the final semiconductor device structure. In some embodiments, the amount of germanium in a silicon germanium film is less than 20%, or greater than 60%, according to the band gap of transistors being manufactured in the semiconductor device. In a non-limiting example, a transistor material for the source region, the drain region, and the channel region of a GAA transistor comprises silicon, and the spacing material comprises silicon germanium.

In some embodiments, the nanosheet structure for an active area comprises one pair of layers (e.g., one layer of transistor material, and one layer of spacing material). In some embodiments, the nano sheet structure for an active area comprises two pairs of layers (e.g., one layer of transistor material, one layer of spacing material, a second layer of transistor material, and a second layer of spacing material). In some embodiments, the nanosheet structure for an active area comprises three pairs of layers (e.g., one layer of transistor material, one layer of spacing material, a second layer of transistor material, a second layer of spacing material, a third layer of transistor material, and a third layer of spacing material, see FIG. 2B). In some embodiments, the layer of spacing material is deposited between the first layer of transistor material and the substrate. In some embodiments, the first layer of transistor material is deposited over the substrate between the substrate and the first layer of spacing material.

Method 600 includes an operation 608, wherein gate structures are manufactured over the active areas. For an example of a gate structure, see semiconductor device 300, elements gate dielectric material 305, gate structure 307, and spacer material 309A. In some embodiments, the gate structures manufactured over the active areas are gate structures over the SAA ESD protection device active areas. In some embodiments, the same manufacturing process which manufactures the gate structures over the SAA ESD protection device active areas also manufactures electrodes for functional transistors of the semiconductor device. In some embodiments, operation 608 includes steps for depositing a blanket layer of gate dielectric material over the top surface of the nanosheet structures manufactured in operation 606. In some embodiments, the gate dielectric layer comprises hafnium oxide (HfO), ruthenium oxide (RuO), silicon dioxide (SiO2), or some other gate dielectric material compatible with a FinFET device or a gate-all-around device. Gate dielectric material is deposited over the active areas by, e.g., a chemical vapor deposition (CVD) process or an atomic layer deposition (ALD) process, or an epitaxial process.

In some embodiments, operation 608 includes steps for depositing a gate electrode material over the layer of gate dielectric material. In some embodiments, the gate electrode material comprises polysilicon or some other semiconductor material or a conductive material. In some embodiments, the gate structures manufactured for the SAA ESD protection device or the functional logic transistors are replacement metal gate electrodes. In some embodiments, gate electrode material is deposited over the gate dielectric material by, e.g., a CVD process or a plasma vapor deposition (PVD) process.

In some embodiments, operation 608 includes steps for depositing a layer of patterning material over the top surface of the gate electrode material, transferring a pattern to the layer of patterning material, and performing an etch process through openings in the pattern to form individual lines of gate electrode material and gate dielectric material over the active areas of, e.g., the SAA ESD protection device and/or the functional logic transistors.

In some embodiments, subsequent to performing the patterning and etch steps described above on the gate electrode material and the gate dielectric material, operation 608 includes steps related to the deposition of a spacer material over the sides of the lines of gate electrode material and gate dielectric material. In some embodiments, the spacer material is silicon nitride. In some embodiments, the spacer material is silicon oxy-nitride, or some other spacer material known in the art. In some embodiments, the spacer material is deposited over the gate electrode lines as a conformal film or a blanket film, and the film is etched to remove horizontal-oriented portions (e.g., portions which extend approximately parallel to the gate dielectric material). In some embodiments, the etch process which removes the "horizontal-oriented" portions of the conformal film of spacer material rounds the spacer material at the "top" edges of the gate electrode lines (e.g., the edges of the gate electrode material distal from the gate dielectric layer).

According to some embodiments of the present disclosure, a semiconductor device (or, a SAA ESD protection device) which has nanosheet-type active areas undergoes an etch process to trim the nanosheet along the long dimension of the nanosheet, such that the nanosheet is trimmed into active area lines distributed along the long dimension of the active area. In some embodiments, an etch process is performed to recess the transistor material inward from the openings formed extending through the nanosheet. In some embodiments, an etch process is performed to recess the spacer material inward from the openings through the nanosheet. In embodiments wherein one or both of the transistor material and the spacing material is recessed inward from the openings formed extending through the nanosheet, deposition of the spacer material is performed after the recessing inward, such that, by etching to remove the "horizontal-oriented" portions of the conformal film of spacer material, the portions of the spacer material along the sidewalls of the nanosheet are covered, and the recessed portions remain protected by spacer material (see, e.g., spacer material 257B of semiconductor device 200, FIG. 2B, above) while protruding portions are removed to give the opening a smooth sidewall in preparation for depositing N-doped semiconductor material in operation 610 to form collector and emitter regions of the SAA ESD protection device.

Method 600 includes an operation 610, wherein collector regions and emitter regions of the SAA ESD protection device are manufactured. For example, semiconductor device 300 includes collector C4 and emitters E4 and E5, as described above. In some embodiments, an etch process is performed to expose the substrate material (e.g., the doped P-well) between the active areas and to etch a recess therein between the active areas.

In some embodiments such as those having fins or monolithic channels, dielectric material between the fins in the active areas is removed by, e.g., a selective wet etch, to expose the substrate material below the active areas. In some embodiments, a hardmask layer or cap layer is over the top of the gate electrode material in the gate structures or dummy electrodes to protect the gate electrode material from etch processes.

In some embodiments, collector regions are manufactured by performing an etch step on exposed substrate material in the emitter and collector regions between the gate structures, forming self-aligned FinFET-type fins below the gate structures. By forming self-aligned FinFET-type fins immediately prior forming the N-doped semiconductor material for emitter and collector regions, the top surface of the substrate (the P-doped well) is preserved in a flat state, making the gate dielectric material and gate electrode material more uniform across the SAA ESD protection device.

In some embodiments of operation 610, subsequent to forming the self-aligned FinFET-type fins, an epitaxial growth process is performed in order to grow or deposit N-doped semiconductor material in the emitter regions and the collector regions, forming a BJT with a high-gain operating condition (because the space between an emitter region and the adjacent collector region smaller (e.g., about 10 nanometers) than in a MAA ESD protection device). In some embodiments, the N-doped semiconductor material is deposited into an opening between FinFET-type fins and fills the opening, as well as a portion of the area along a sidewall of the spacer material in the gate structures of the SAA ESD protection device.

In some embodiments, N-doped semiconductor material is deposited at the exposed surface of the substrate and in contact with the sidewalls of the trimmed nanosheet segments which mark the edges of the emitter and collector regions of the SAA ESD protection device.

In some embodiments, the N-doped semiconductor material has a net N-type dopant concentration of not less than $1\times10^{12}$, and not greater than $1\times10^{13}$, atoms/cm$^2$. Dopant concentrations less than about $1\times10^{12}$ atoms/cm$^2$ decrease the current-carrying capacity of the SAA ESD protection device such that the device loses sensitivity in responding to ESD events. Dopant concentrations greater than about $1\times10^{13}$ atoms/cm$^2$ decrease the resistance of the SAA ESD protection device such that the SAA ESD protection device does not provide protection from ESD events.

Method 600 includes an operation 612, wherein DTIs are manufactured through the active areas of the SAA ESD protection device. For example, DTI 310A and DTI 310B in semiconductor device 300 extend into substrate 302 to separate collector regions C4, C5, and C6, from emitter regions E4 and E5, and from emitter regions E6 and E7, at opposite ends of the collector regions. In some embodiments, after the N-doped semiconductor material has been manufactured in the emitter and collector regions, a layer of masking material is deposited over the SAA ESD protection device and a pattern transferred thereto, such that some gate structures are exposed through the openings in the layer of masking material. In some embodiments, the layer of masking material is a photoresist material or a material suitable for UV patterning techniques. Gate structures are selected for etching based on the spacing of the gate structures along the active area. In some embodiments, the spacing of DTIs, or gate structures within openings in the layer of patterning material, occurs at an interval of $N_{SAA}$, where $N_{SAA}=N_G=N_{CPP}-1$, where every $N_{SAA}$ gate structure is converted to a DTI. In some embodiments, $N_{SAA}=1$. In some embodiments, $N_{SAA}=2$. In some embodiments, $N_{SAA}=3$. In some embodiments, $N_{SAA}=4$. In some embodiments, $N_{SAA}=5$. In some embodiments, $N_{SAA}=6$. $N_{SAA}$ is selected during a semiconductor device design process, in conjunction with the value of CPP (the pitch between dummy electrodes or gate structures, and the width W of the active area (see, e.g., W1 of SAA ESD protection device 102, above), such that the area of the collector and emitter regions of the SAA ESD protection device are within a current-conducting specification of the semiconductor device, and that the gain of the bipolar junction transistor formed with the substrate is sufficiently large to trigger operation of the SAA ESD protection device during semiconductor device operation.

An etch process is performed to remove the gate electrode material and the gate dielectric material from within the spacer material of the selected gate structures, and a further etch process is performed to etch an opening into the substrate (or, the P-doped well in the substrate), for subsequent filling with dielectric material. In some embodiments, the DTIs have a depth (see depth D2 of FIG. 3) below the top surface of the substrate of about 200 nm. Depths greater than about 200 nm increase the manufacturing time without significantly modifying the resistance between the P-doped region (see P-doped region 303 of Semiconductor device 300) and the N-doped semiconductor material of the emitter regions, and between the N-doped semiconductor material of the collector regions and the N-doped semiconductor material of the emitter regions.

Method 600 includes an operation 614, wherein the emitter regions are electrically connected, outside of the substrate, to the P-doped region outside the perimeter of the SAA ESD protection device (see operation 604). For example, see electrical connection 301A of semiconductor device 300, as described above. In some embodiments, a dielectric material is deposited over the gate structures and the DTIs. In some embodiments, contacts are formed extending through the layer of dielectric material and in electrical contact to [1] the emitter region N-doped semiconductor material, [2] the P-doped region outside the SAA ESD protection device, and [3] the collector N-doped semiconductor material.

A conductive line is formed electrically connecting the contact to the [1] the emitter region N-doped semiconductor material, [2] the P-doped region outside the SAA ESD protection device, electrically tying the emitter regions to the substrate through the P-doped region.

Method 600 includes an operation 616, wherein the collector regions are electrically connected together for each SAA ESD protection device of the semiconductor device. See, for example, electrical connection 301B of semiconductor device 300, as described above. In some embodiments, operation 616 is performed simultaneously with operation 614, wherein conductive lines formed in the same manufacturing flow are formed to electrically connect the contact to the N-doped semiconductor material of the collector regions to each other, in electrical isolation from a remainder of the semiconductor device interconnect structure.

Method 600 includes an operation 618, wherein an isolation structure extending around a perimeter of each SAA ESD protection device is manufactured. For example, see STI 308 of semiconductor device 300, as described above. In operation 618, the method includes steps for depositing a layer of patterning material over the top surface of the gate structures and the substrate, transferring a pattern to the layer of patterning material, and performing an etch process through openings in the pattern to recess a portion of the substrate around a perimeter of the SAA ESD protection device region as described in FIG. 5, or around the SAA ESD protection device and functional logic region as described in FIG. 4, to electrically isolate individual SAA ESD protection devices from each other, and from the functional logic transistors of the semiconductor device. In some embodiments, shallow trench isolation structures are filled using CVD to deposit, e.g., silicon dioxide or some other dielectric material into the etched openings and around the SAA ESD protection device region and the functional logic region as described above.

Figure 7:
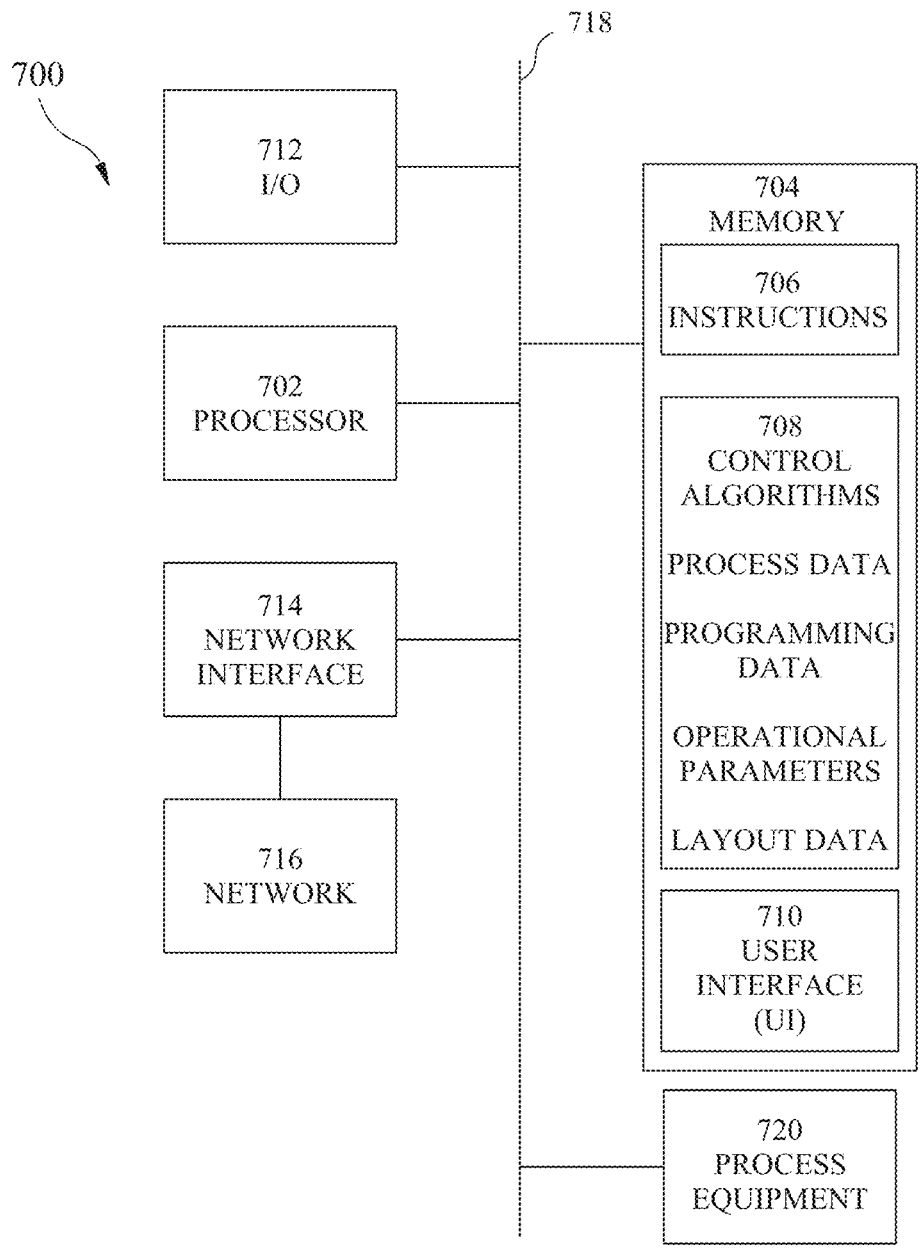
FIG. 7 is a block diagram of an electronic process control (EPC) system, in accordance with some embodiments

FIG. 7 is a block diagram of an electronic process control (EPC) system 700, in accordance with some embodiments. Methods used for generating cell layout diagrams corresponding to some embodiments of the GAA structures detailed above, for example, using EPC system 700, in accordance with some embodiments of such systems. In some embodiments, EPC system 700 is a general-purpose computing device including a hardware processor 702 and a non-transitory, computer-readable storage medium 704. Computer-readable storage medium 704, amongst other things, is encoded with, i.e., stores, computer program code (or instructions) 706, i.e., a set of executable instructions. Execution of computer program code 706 by hardware processor 702 represents (at least in part) an EPC tool which implements at least a portion of the methods described herein in accordance with one or more of the structures and methods detailed herein.

Hardware processor 702 is electrically coupled to computer-readable storage medium 704 via a bus 718. Hardware processor 702 is also electrically coupled to an I/O interface 712 by bus 718. A network interface 714 is also electrically connected to hardware processor 702 via bus 718. Network interface 714 is connected to a network 716, so that both the hardware processor 702 and the computer-readable storage medium 704 can connect to external elements via network 716. Hardware processor 702 is configured to execute computer program code 706 encoded in computer-readable storage medium 704 to cause EPC system 700 to be usable for performing at least a portion of the noted processes and/or methods. In one or more embodiments, hardware processor 702 is a central processing unit (CPU), a multiprocessor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, computer-readable storage medium 704 stores computer program code 706 configured to cause the EPC system 700 (where such execution represents (at least in part) the EPC tool) to be usable for performing a portion or all of the noted processes and/or methods. In one or more embodiments, computer-readable storage medium 704 also stores information which facilitates performing a portion or all of the noted processes and/or methods. In one or more embodiments, computer-readable storage medium 704 stores process control data 708 including, in some embodiments, control algorithms, process variables and constants, target ranges, set points, programming control data, and code for enabling statistical process control (SPC) and/or model predictive control (MPC) based control of the various processes.

EPC system 700 includes I/O interface 712. I/O interface 712 is coupled to external circuitry. In one or more embodiments, I/O interface 712 includes a keyboard, keypad, mouse, trackball, trackpad, touchscreen, and/or cursor direction keys for communicating information and commands to hardware processor 702.

EPC system 700 also includes network interface 714 coupled to hardware processor 702. Network interface 714 allows EPC system 700 to communicate with network 716, to which one or more other computer systems are connected. Network interface 714 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EPC systems 700.

EPC system 700 is configured to send information to and receive information from fabrication tools 720 that include one or more of ion implant tools, etching tools, deposition tools, coating tools, rinsing tools, cleaning tools, chemical-mechanical planarizing (CMP) tools, testing tools, inspection tools, transport system tools, and thermal processing tools that will perform a predetermined series of manufacturing operations to produce the desired integrated circuit devices. The information includes one or more of operational data, parametric data, test data, and functional data used for controlling, monitoring, and/or evaluating the execution, progress, and/or completion of the specific manufacturing process. The process tool information is stored in and/or retrieved from computer-readable storage medium 704.

EPC system 700 is configured to receive information through I/O interface 712. The information received through I/O interface 712 includes one or more of instructions, data, programming data, design rules that specify, e.g., layer thicknesses, spacing distances, structure and layer resistivity, and feature sizes, process performance histories, target ranges, set points, and/or other parameters for processing by hardware processor 702. The information is transferred to hardware processor 702 via bus 718. EPC system 700 is configured to receive information related to a user interface (UI) through I/O interface 712. The information is stored in computer-readable medium 704 as user interface (UI) 710.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EPC tool. In some embodiments, a portion or all of the noted processes and/or methods is implemented as a software application that is used by EPC system 700.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
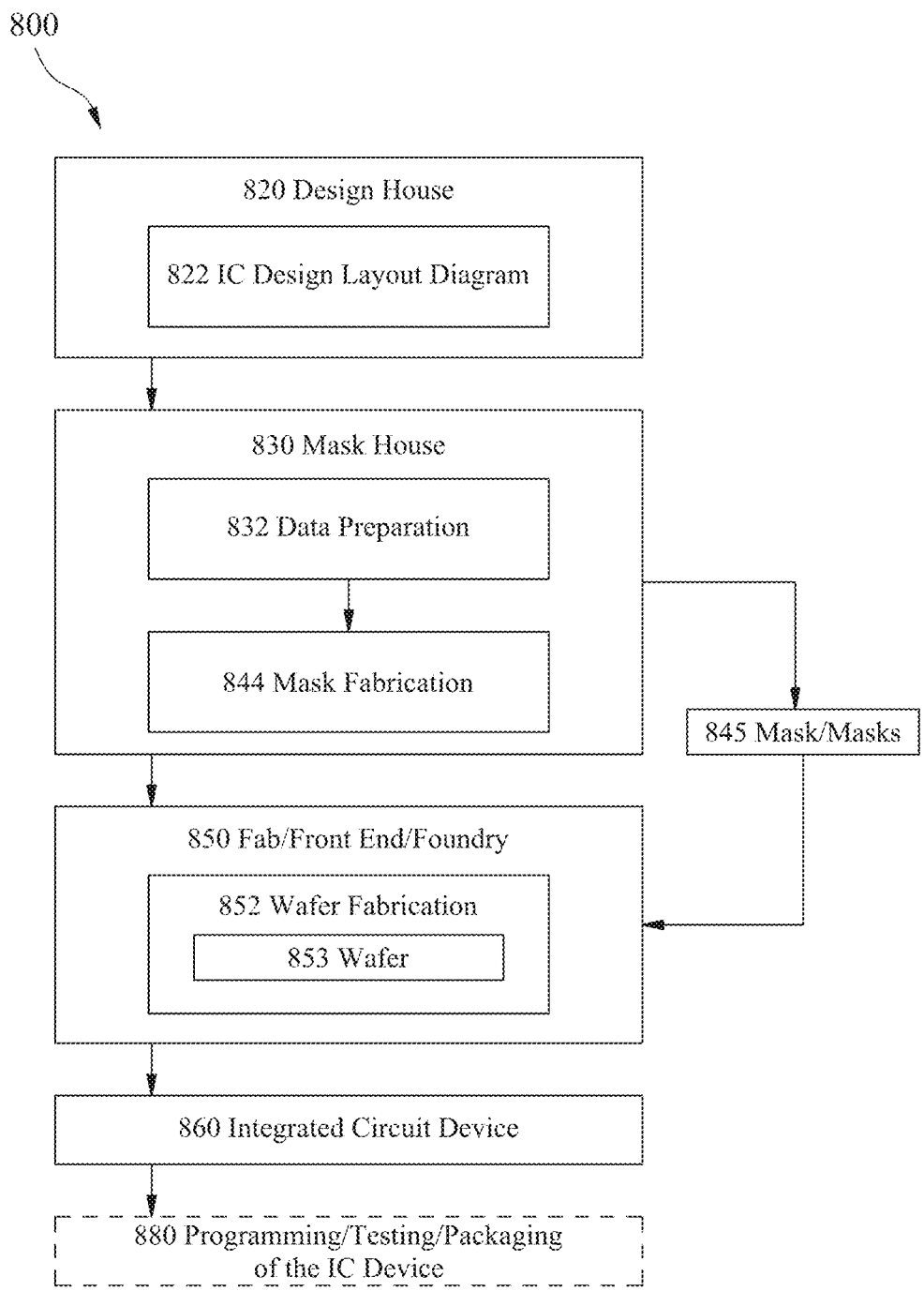
FIG. 8 is a block diagram of an integrated circuit (IC) manufacturing system, and an IC manufacturing flow associated therewith, in accordance with some embodiments for manufacturing IC devices.

FIG. 8 is a block diagram of an integrated circuit (IC) manufacturing system 800, and an IC manufacturing flow associated therewith, in accordance with some embodiments for manufacturing IC devices. In some embodiments, based on a layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. Once the manufacturing process has been completed to form a plurality of IC devices on a wafer, the wafer is optionally sent to backend or back end of line (BEOL) 880 for, depending on the device, programming, electrical testing, and packaging in order to obtain the final IC device products. The entities in manufacturing system 800 are connected by a communications network. In some embodiments, the communications network is a single network. In some embodiments, the communications network is a variety of different networks, such as an intranet and the Internet.

The communications network includes wired and/or wireless communication channels. Each entity interacts with one or more of the other entities and provides services to and/or receives services from one or more of the other entities. In some embodiments, two or more of design house 820, mask house 830, and IC Fab 850 is owned by a single larger company. In some embodiments, two or more of design house 820, mask house 830, and IC Fab 850 coexist in a common facility and use common resources.

Design house (or design team) 820 generates an IC design layout diagram 822. IC design layout diagram 822 includes various geometrical patterns designed for an IC device 860. The geometrical patterns correspond to patterns of metal, oxide, or semiconductor layers that make up the various components of IC device 860 to be fabricated. The various layers combine to form various IC features.

For example, a portion of IC design layout diagram 822 includes various IC features, such as an active region, gate electrode, source and drain, metal lines or vias of an inter-layer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Whereas the pattern of a modified IC design layout diagram is adjusted by an appropriate method in order to, for example, reduce parasitic capacitance of the integrated circuit as compared to an unmodified IC design layout diagram, the modified IC design layout diagram reflects the results of changing positions of conductive line in the layout diagram, and, in some embodiments, inserting to the IC design layout diagram, features associated with capacitive isolation structures to further reduce parasitic capacitance, as compared to IC structures having the modified IC design layout diagram without features for forming capacitive isolation structures located therein.

Mask house 830 includes mask data preparation 832 and mask fabrication 844. Mask house 830 uses IC design layout diagram 822 to manufacture one or more masks (or photomasks, or reticles) 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask 845 or a semiconductor wafer 853. The IC design layout diagram 822 is manipulated by mask data preparation 832 to comply with particular characteristics of the mask writer and/or requirements of IC Fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC Fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, mask data preparation 832 includes additional features such as a logic operation (LOP) to modify the IC design layout diagram 822 according to manufacturing rules. Additionally, the processes applied to IC design layout diagram 822 during mask data preparation 832 may be executed in a variety of different orders. After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask.

In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes. IC Fab 850 includes wafer fabrication 852. IC Fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

Wafer fabrication 852 includes forming a patterned layer of mask material formed on a semiconductor substrate is made of a mask material that includes one or more layers of photoresist, polyimide, silicon oxide, silicon nitride (e.g., $Si_3N_4$, SiON, SiC, SiOC), or combinations thereof. In some embodiments, masks 845 include a single layer of mask material. In some embodiments, a mask 845 includes multiple layers of mask materials.

In some embodiments, the mask material is patterned by exposure to an illumination source. In some embodiments, the illumination source is an electron beam source. In some embodiments, the illumination source is a lamp that emits light. In some embodiments, the light is ultraviolet light. In some embodiments, the light is visible light. In some embodiments, the light is infrared light. In some embodiments, the illumination source emits a combination of different (UV, visible, and/or infrared) light.

Subsequent to mask patterning operations, areas not covered by the mask, e.g., fins in open areas of the pattern, are etched to modify a dimension of one or more structures within the exposed area(s). In some embodiments, the etching is performed with plasma etching, or with a liquid chemical etch solution, according to some embodiments. The chemistry of the liquid chemical etch solution includes one or more of etchants such as citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$) potassium hydroxide (KOH), ethylenediamine pyrocatechol (EDP), TMAH (tetramethylammonium hydroxide), or a combination thereof.

In some embodiments, the etching process is a dry-etch or plasma etch process. Plasma etching of a substrate material is performed using halogen-containing reactive gases excited by an electromagnetic field to dissociate into ions. Reactive or etchant gases include, for example, $CF_4$, $SF_6$, $NF_3$, $Cl_2$, $CCl_2F_2$, $SiCl_4$, $BCl_2$, or a combination thereof, although other semiconductor-material etchant gases are also envisioned within the scope of the present disclosure. Ions are accelerated to strike exposed material by alternating electromagnetic fields or by fixed bias according to methods of plasma etching that are known in the art.

In some embodiments, etching processes include presenting the exposed structures in the functional area(s) in an oxygen-containing atmosphere to oxidize an outer portion of the exposed structures, followed by a chemical trimming process such as plasma-etching or liquid chemical etching, as described above, to remove the oxidized material and leave behind a modified structure. In some embodiments, oxidation followed by chemical trimming is performed to provide greater dimensional selectivity to the exposed material and to reduce a likelihood of accidental material removal during a manufacturing process. In some embodiments, the exposed structures include the nanosheets and/or gate structures of gate-all-around (GAA) devices with the gate structures being embedded in a dielectric support medium covering the sides of the gate structures. In some embodiments, the exposed portions of the gate structures of the functional area are top surfaces and sides of the gate structures that are above a top surface of the dielectric support medium, where the top surface of the dielectric support medium has been recessed to a level below the top surface of the nanosheet stacks, but still covering a lower portion of the sides of the nanosheet stacks.

IC Fab 850 uses mask(s) 845 fabricated by mask house 830 to fabricate IC device 860. Thus, IC Fab 850 at least indirectly uses IC design layout diagram 822 to fabricate IC device 860. In some embodiments, semiconductor wafer 853 is fabricated by IC Fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multi-level interconnects, and the like (formed at subsequent manufacturing steps).

Figure 9:
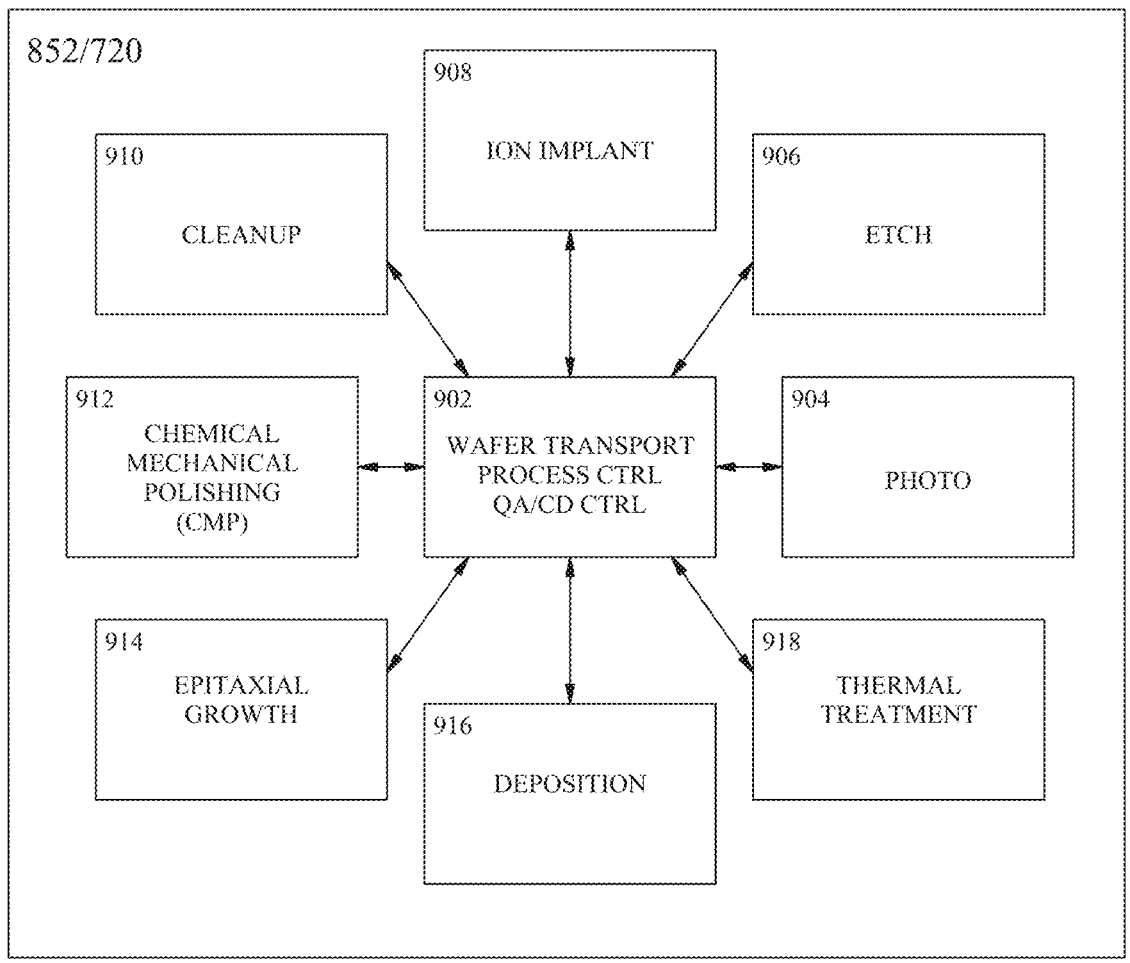
FIG. 9 is a schematic diagram of various processing departments defined within a Fab/Front End/Foundry for manufacturing IC devices according to some embodiments.

FIG. 9 is a schematic diagram of various processing departments defined within a Fab/Front End/Foundry for manufacturing IC devices according to some embodiments as suggested in FIG. 7, specifically in blocks 708 and 720 and FIG. 8, specifically in block 850. The processing departments utilized in front end of line (FEOL) IC device manufacturing typically include a wafer transport operation 902 for moving the wafers between the various processing departments. In some embodiments, the wafer transport operation will be integrated with an electronic process control (EPC) system according to FIG. 7 and utilized for providing process control operations, ensuring that the wafers being both processed in a timely manner and sequentially delivered to the appropriate processing departments as determined by the process flow. In some embodiments, the EPC system will also provide control and/or quality assurance and parametric data for the proper operation of the defined processing equipment. Interconnected by the wafer transport operation 902 will be the various processing departments providing, for example, photolithographic operations 904, etch operations 906, ion implant operations 908, clean-up/strip operations 910, chemical mechanical polishing (CMP) operations 912, epitaxial growth operations 914, deposition operations 916, and thermal treatments 918.

Additional details regarding integrated circuit (IC) manufacturing systems and an IC manufacturing flows associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, each of which are hereby incorporated, in their entireties, by reference.

An aspect of this description relates to a semiconductor device. The semiconductor device includes a substrate. The semiconductor device further includes a doped well in the substrate, wherein the doped well comprises a first concentration of dopants of a first type in the substrate. The semiconductor device further includes a doped region in the substrate, wherein the doped region comprises a second concentration of the dopants of the first type, the doped region extends around the doped well, and the doped region is electrically insulated from the doped well. The semiconductor device further includes an active area, and wherein the active area comprises an emitter region and a collector region, wherein the emitter region is electrically connected to the doped region. The semiconductor device further includes a deep trench isolation (DTI) structure extending through the active area and between the emitter region and the collector region. In some embodiments, the emitter region includes a channel region. In some embodiments, the channel region is within a fin structure. In some embodiments, the channel region is within a nanosheet. In some embodiments, the semiconductor device further includes a second emitter region electrically connected to the doped region. In some embodiments, the second emitter region is between the emitter region and the doped region. In some embodiments, the semiconductor device further includes a shallow trench isolation (STI) structure between the emitter region and the doped region. In some embodiments, the semiconductor device further includes a second collector region electrically connected to the collector region. In some embodiments, the second collector region is between the DTI and the collector region.

An aspect of this description relates to a method of making a semiconductor device. The method includes doping a substrate to define a P-doped well. The method further includes doping the substrate to define a P-doped region around the P-doped well. The method further includes defining an active area in the substrate. The method further includes forming a gate structure over the active area. The method further includes defining, in the active area, a collector region and an emitter region. The method further includes etching an opening in the substrate between the collector region and the emitter region. The method further includes filling the opening with an isolation material to define a deep trench isolation structure (DTI). In some embodiments, the method further includes electrically connecting the emitter region to the P-doped region. In some embodiments, forming the gate structure includes forming the gate structure over a fin structure. In some embodiments, forming the gate structure includes forming the gate structure around a nanosheet. In some embodiments, the method further includes defining a second collector region, wherein the second collector region is between the collector region and the DTI. In some embodiments, the method further includes electrically connecting the collector region and the second collector region.

An aspect of this description relates to a semiconductor device. The semiconductor device includes a substrate. The semiconductor device further includes an active area in the substrate, wherein the active area defines a plurality of emitter regions and a plurality of collector regions. The semiconductor device further includes a doped region in the substrate, wherein the doped region extends around the active area. The semiconductor device further includes a shallow trench isolation (STI) structure between the active area and the doped region. The semiconductor device further includes a deep trench isolation (DTI) structure extending through the active area, wherein the DTI structure is between the plurality of emitter regions and the plurality of collector regions. In some embodiments, each of the plurality of emitter regions is electrically connected to the doped region. In some embodiments, each of the plurality of collector regions is electrically connected to another collector region of the plurality of collector regions. In some embodiments, at least one of the plurality of collector regions includes a channel in a fin structure. In some embodiments, at least one of the plurality of collector regions comprises a channel in a nanosheet.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a doped well in the substrate, wherein the doped well comprises a first concentration of dopants of a first type in the substrate;
   a doped region in the substrate, wherein the doped region comprises a second concentration of the dopants of the first type, the doped region extends around the doped well, and the doped region is electrically insulated from the doped well;
   an active area, and wherein the active area comprises an emitter region and a collector region, wherein the emitter region is electrically connected to the doped region; and
   a deep trench isolation (DTI) structure extending through the active area and between the emitter region and the collector region.

2. The semiconductor device of claim 1, wherein the emitter region comprises a channel region.

3. The semiconductor device of claim 2, wherein the channel region is within a fin structure.

4. The semiconductor device of claim 2, wherein the channel region is within a nanosheet.

5. The semiconductor device of claim 1, further comprising a second emitter region electrically connected to the doped region.

6. The semiconductor device of claim 5, wherein the second emitter region is between the emitter region and the doped region.

7. The semiconductor device of claim 1, further comprising a shallow trench isolation (STI) structure between the emitter region and the doped region.

8. The semiconductor device of claim 1, further comprising a second collector region electrically connected to the collector region.

9. The semiconductor device of claim 8, wherein the second collector region is between the DTI and the collector region.

10. A method of making a semiconductor device, comprising:
    doping a substrate to define a P-doped well;
    doping the substrate to define a P-doped region around the P-doped well;
    defining an active area in the substrate;
    forming a gate structure over the active area;
    defining, in the active area, a collector region and an emitter region;
    etching an opening in the substrate between the collector region and the emitter region; and
    filling the opening with an isolation material to define a deep trench isolation structure (DTI).

11. The method of claim 10, further comprising electrically connecting the emitter region to the P-doped region.

12. The method of claim 10, wherein forming the gate structure comprises forming the gate structure over a fin structure.

13. The method of claim 10, wherein forming the gate structure comprises forming the gate structure around a nanosheet.

14. The method of claim 10, further comprising defining a second collector region, wherein the second collector region is between the collector region and the DTI.

15. The method of claim 14, further comprising electrically connecting the collector region and the second collector region.

16. A semiconductor device, comprising:
   a substrate;
   an active area in the substrate, wherein the active area defines a plurality of emitter regions and a plurality of collector regions;
   a doped region in the substrate, wherein the doped region extends around the active area;
   a shallow trench isolation (STI) structure between the active area and the doped region; and
   a deep trench isolation (DTI) structure extending through the active area, wherein the DTI structure is between the plurality of emitter regions and the plurality of collector regions.

17. The semiconductor device of claim 16, wherein each of the plurality of emitter regions is electrically connected to the doped region.

18. The semiconductor device of claim 16, wherein each of the plurality of collector regions is electrically connected to another collector region of the plurality of collector regions.

19. The semiconductor device of claim 16, wherein at least one of the plurality of collector regions comprises a channel in a fin structure.

20. The semiconductor device of claim 16, wherein at least one of the plurality of collector regions comprises a channel in a nanosheet.

* * * * *